(12) United States Patent
Okuzuka

(10) Patent No.: US 10,317,435 B2
(45) Date of Patent: Jun. 11, 2019

(54) BUS BAR ASSEMBLE TYPE ELECTRIC CURRENT SENSOR

(71) Applicant: CALSONIC KANSEI CORPORATION, Saitama-shi, Saitama (JP)

(72) Inventor: Gen Okuzuka, Saitama (JP)

(73) Assignee: CALSONIC KANSEI CORPORATION, Saitama-Shi, Saitama (JP)

( * ) Notice: Subject to any disclaimer, the term of this patent is extended or adjusted under 35 U.S.C. 154(b) by 63 days.

(21) Appl. No.: 15/568,119

(22) PCT Filed: Apr. 12, 2016

(86) PCT No.: PCT/JP2016/061811
§ 371 (c)(1),
(2) Date: Oct. 20, 2017

(87) PCT Pub. No.: WO2016/171039
PCT Pub. Date: Oct. 27, 2016

(65) Prior Publication Data
US 2018/0113156 A1 Apr. 26, 2018

(30) Foreign Application Priority Data
Apr. 23, 2015 (JP) .................................. 2015-088173

(51) Int. Cl.
*G01R 19/00* (2006.01)
*H02G 5/04* (2006.01)
*G01R 15/20* (2006.01)

(52) U.S. Cl.
CPC ....... *G01R 19/0092* (2013.01); *G01R 15/202* (2013.01); *G01R 15/207* (2013.01); *H02G 5/04* (2013.01)

(58) Field of Classification Search
CPC ....... G01R 15/207; G01R 15/202; H02G 5/04
See application file for complete search history.

(56) References Cited

U.S. PATENT DOCUMENTS

2001/0026017 A1* 10/2001 Seto ..................... H03H 1/0007
257/736
2006/0119343 A1 6/2006 Saito et al.
(Continued)

FOREIGN PATENT DOCUMENTS

JP H03-083418 U1 8/1991
JP H06-276646 A 9/1994
(Continued)

*Primary Examiner* — Jermele M Hollington
*Assistant Examiner* — Alvaro E Fortich
(74) *Attorney, Agent, or Firm* — Foley & Lardner LLP

(57) ABSTRACT

A bus bar assemble type electric current sensor includes a sensing module that has a resin molding and a sensing element provided in the resin molding, and a bus bar module that has a casing and a bus bar accommodated in the casing and disposed in the vicinity of the sensing element. A temporarily-fixing portion that temporarily fixes the sensing module and the bus bar module separably is provided on at least one of the sensing module and the bus bar module. A fully-fixing portion that integrally fixes the sensing module and the bus bar module with each other is provided on each of the sensing module and the bus bar module.

5 Claims, 5 Drawing Sheets

(56) References Cited

U.S. PATENT DOCUMENTS

| | | | |
|---|---|---|---|
| 2010/0065307 A1* | 3/2010 | Nagase | H05K 1/021 |
| | | | 174/252 |
| 2013/0169267 A1 | 7/2013 | Miyakoshi et al. | |
| 2013/0342300 A1* | 12/2013 | Nagata | H01F 17/06 |
| | | | 336/175 |

FOREIGN PATENT DOCUMENTS

| | | |
|---|---|---|
| JP | 2006-166528 A | 6/2006 |
| JP | 2008-082736 A | 4/2008 |
| JP | 2013-238580 A | 11/2013 |

\* cited by examiner (a)

(b)

BUS BAR ASSEMBLE TYPE ELECTRIC CURRENT SENSOR

TECHNICAL FIELD

The present invention relates to a bus bar assemble type electric current sensor.

BACKGROUND ART

For example, an electric current sensor for measuring a battery electric current or a motor drive electric current is installed in a hybrid car or an electric car. Such an electric current sensor measures, by using a Hall element or the like, an electric current flowing through a bus bar(s) as an electrically conductive member that connects various electric devices.

Various technologies with respect to such an electric current sensor are suggested (see a Patent Document 1 listed below, for example). In addition, a bus bar integrated type electric current sensor is also suggested, in which an electric current sensor and a bus bar(s) that is a measuring target are integrated by a resin molding to improve workability at its installation in various devices and durability such as vibration resistance.

PRIOR ART DOCUMENT

Patent Documents

Patent Document 1: Japanese Patent Application Publication No. 2013-238580

SUMMARY OF INVENTION

When checking characteristics of an electric current sensor by a general checker (an inspection device), it is needed to insert a test bus bar(s) into the electric current sensor. However, if the electric current sensor is integrated with a bus bar(s) by a resin molding, it is impossible to insert the test bus bar(s) into the electric current sensor. Therefore, a bus bar integrated type electric current sensor cannot be checked by a general checker.

An object of the present invention is to provide a bus bar assemble type electric current sensor that can be checked easily.

An aspect of the present invention provides a bus bar assemble type electric current sensor comprising: a sensing module that has a resign molding, and a sensing element provided in the resin molding; and a bus bar module that has a casing, and a bus bar accommodated in the casing and disposed in a vicinity of the sensing element, wherein a temporarily-fixing portion that temporarily fixes the sensing module and the bus bar module separably from each other is provided on at least one of the sensing module and the bus bar module, and a fully-fixing portion that integrally fixes the sensing module and the bus bar module with each other is provided on each of the sensing module and the bus bar module.

According to the above aspect, the sensing module and the bus bar module can be handled independently from each other until the sensing module and the bus bar module are temporarily-fixed with each other by the temporarily-fixing portion. Therefore, characteristics of the sensing element can be easily checked by inserting a bus bar of a checker into the sensing module.

DESCRIPTION OF EMBODIMENTS

Figure 1:
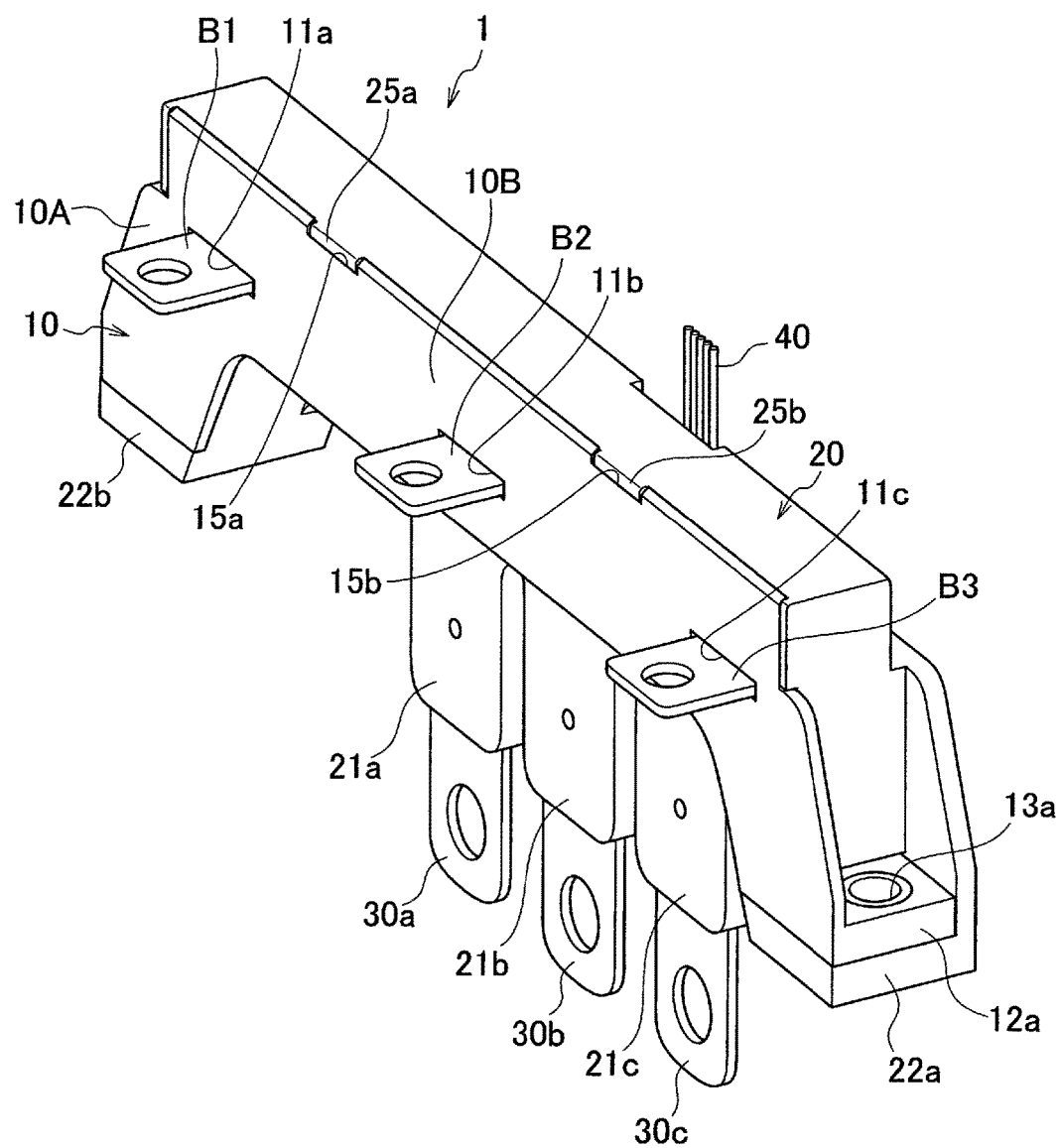
FIG. 1 It is a perspective view of a bus bar assemble type electric current sensor according to an embodiment after being assembled.

Hereinafter, a bus bar assemble type electric current sensor according to an embodiment will be described with reference to FIG. 1 to FIG. 5. In the drawings, identical or equivalent members to each other are labelled with an identical number, and their redundant descriptions will be omitted.

Figure 2:
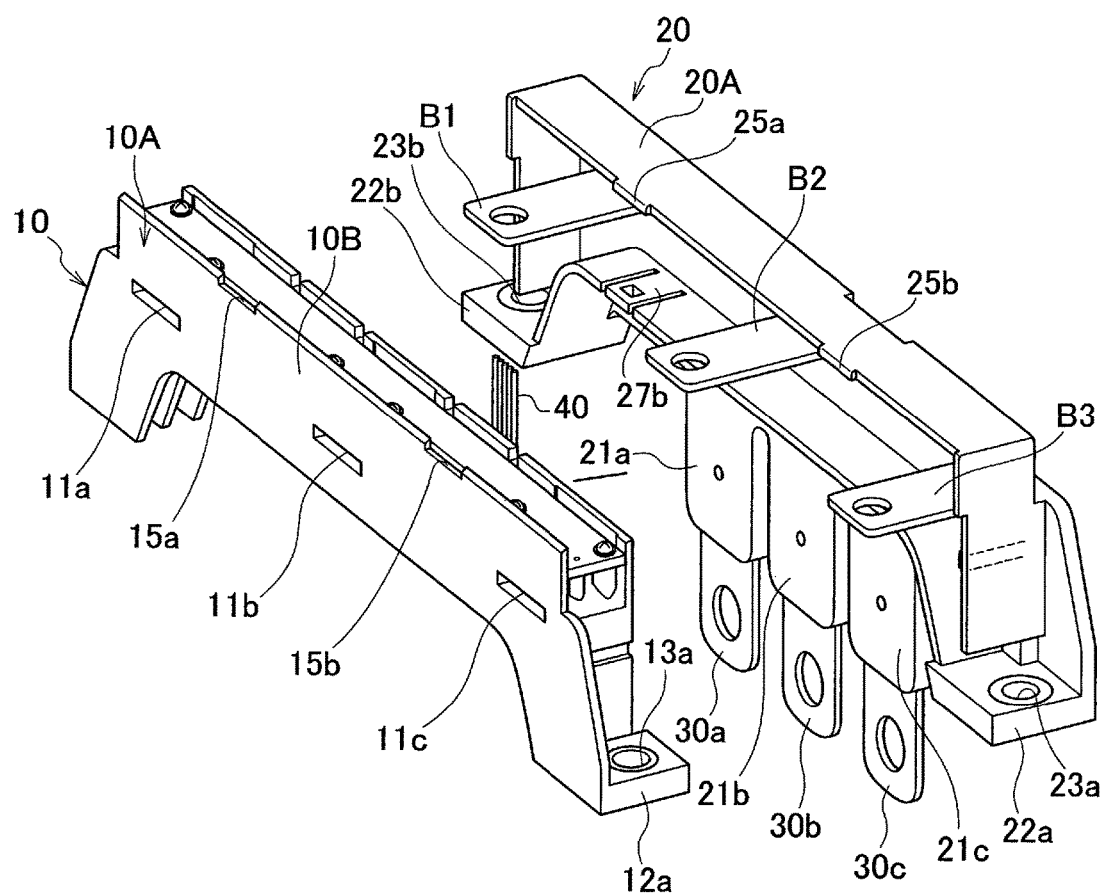
FIG. 2 It is a perspective view of the electric current sensor before being assembled.

As shown in FIG. 1 and FIG. 2, an electric current sensor 1 is configured to include a sensing module 10 and a bus bar module 20.

Figure 3:
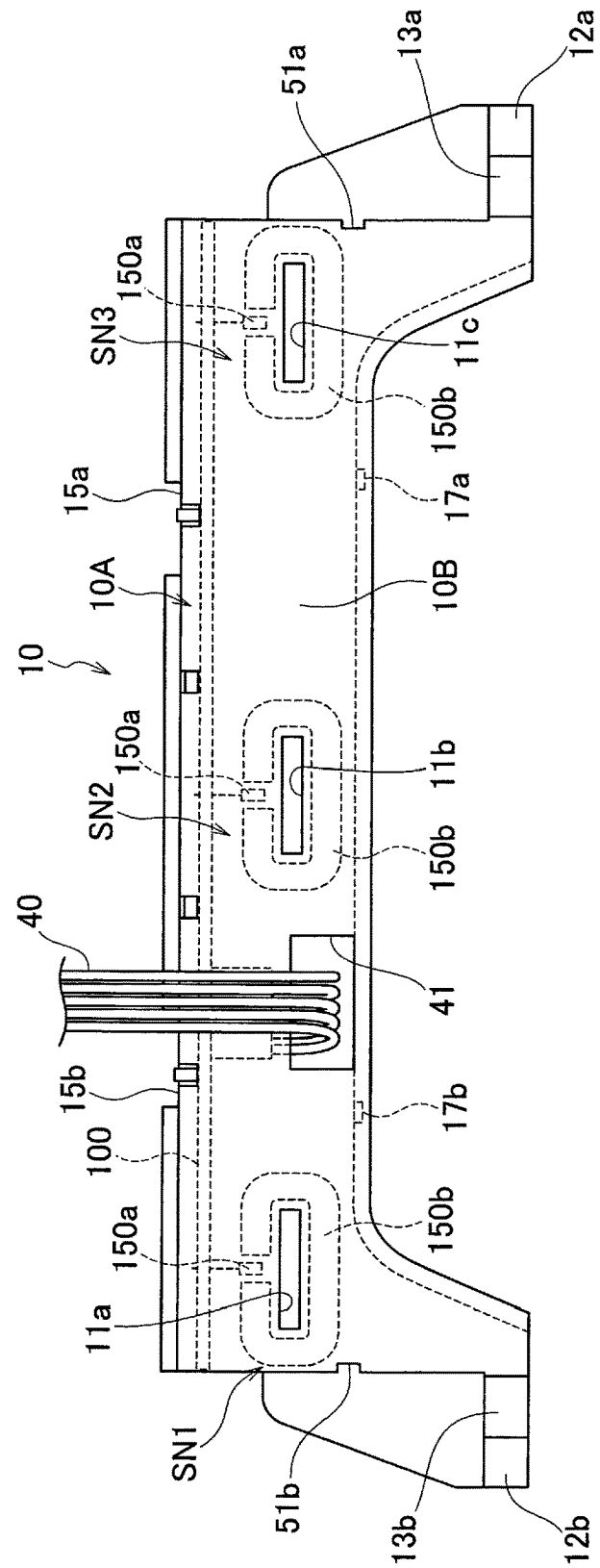
FIG. 3 It is a back view of a sensing module of the electric current sensor.

As shown in FIG. 2 and FIG. 3, the sensing module 10 includes sensing elements SN (SN1 to SN3) in a resin molding 10A that is formed of poly phenylene sulfide (PPS) resin, polybutylene terephthalate (PBT) or the like. The resin molding 10A has a beam 10B extending horizontally, and legs 12a and 12b that are provided at both ends of the beam 10B, respectively. At the leg 12a, provided is a sensor-side communication screw hole 13a for fastening, in a state where the sensing module 10 is temporarily fixed by after-described temporarily-fixing portions, the sensing module 10 and the bus bar module 20 together by a screw. Similarly, at the leg 12b, provided is a sensor-side communication screw hole 13b for fastening, in the state where the sensing module 10 is temporarily fixed, the sensing module 10 and the bus bar module 20 together by a screw.

The three sensing elements SN1 to SN3 are arranged in a horizontal direction in the beam 10B at given intervals. Each of the sensing elements SN1 to SN3 is configured to include a hollow cylindrical magnetic body 150b having a cutout and a Hall element 150a disposed in the cutout. The Hall elements 150a are hung down from a substrate 100. Note that the sensing elements SN to SN3 are not limited to having the above-described configuration. For example, sensing elements SN1 to SN3 each having a magnetosensitive element other than the Hall element may be adopted. In addition, the three sensing elements SN1 to SN3 are provided in the present embodiment, but only one sensing element SN may be provided or four or more sensing elements SN may be provided.

Insertion holes 11a to 11c into which bus bars B1 to B3 of the bus bar module 20 are inserted, respectively, are formed on the beam 10B in which the sensing elements SN1 to SN3 are arranged. After assembling the sensing module 10 and the bus bar module 20, the bus bars B1 to B3 are disposed in the vicinities of the sensing elements SN1 to SN3, respectively, and electric currents flowing through the bus bars B1 to B3 can be measured by the sensing elements SN1 to SN3, respectively.

On outer edges of the beam 10B, provided are engaged portions (temporarily-fixing portions) 15a, 15b, 17a and 17b that can be engaged with after-described engaging portions (temporarily-fixing portions) 25a, 25b, 27a and 27b of the bus bar module 20, respectively. When assembling the sensing module 10 and the bus bar module 20, the engaged portions (temporarily-fixing portions) 15a, 15b, 17a and 17b are engaged with the engaging portions (temporarily-fixing portions) 25a, 25b, 27a and 27b, respectively, and thereby the sensing module 10 and the bus bar module 20 are temporarily fixed with each other. After the sensing module 10 and the bus bar module 20 are temporarily fixed with each other, the sensing module 10 and the bus bar module 20 can be made fully-fixed with each other easily by utilizing the sensor-side communication screw holes 13a and 13b of the sensing module 10 and after-described bus-bar-side communication screw holes 23a and 23b of the bus bar module 20.

As shown in FIG. 3 and FIG. 5(a), on an outer side surface of the leg 12b (12a) of the sensing module 10, formed is a groove 51b (51a) that engages with an after-described protrusion 52b (52a) of the bus bar module 20 to align the sensing module 10 and the bus bar module 20 with each other. Therefore, the sensing module 10 and the bus bar module 20 can be easily aligned with each other when assembling the sensing module 10 and the bus bar module 20, and thereby their assembling workability can be improved. Note that wires 40 shown in FIGS. 1 to 3 transmit electric current values of the bus bars B1 to B3, which are measured by the sensing elements SN1 to SN3, and so on to an external device via the substrate 100.

Figure 4:
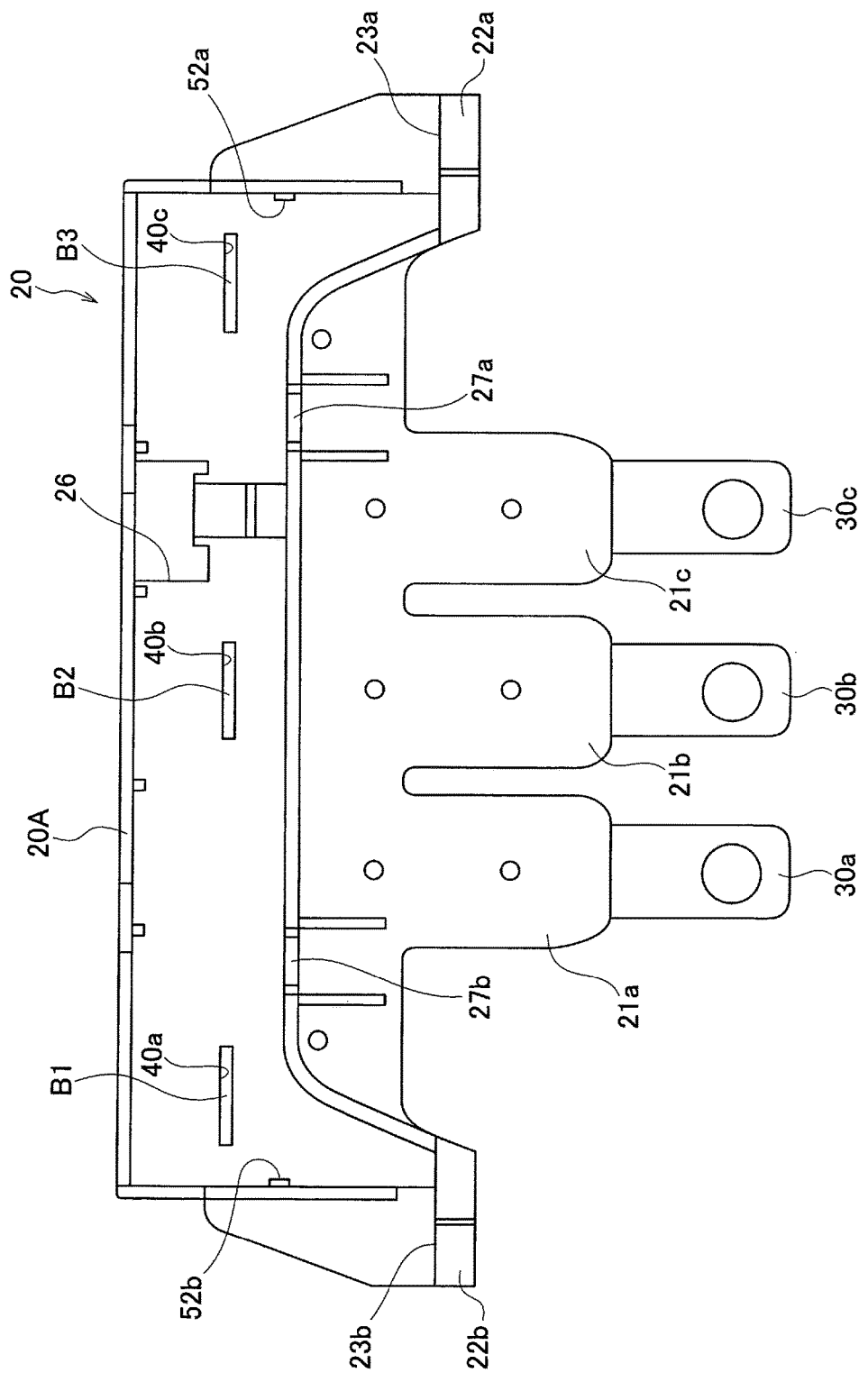
FIG. 4 It is a front view of a bus bar module of the electric current sensor.
Figure 5:
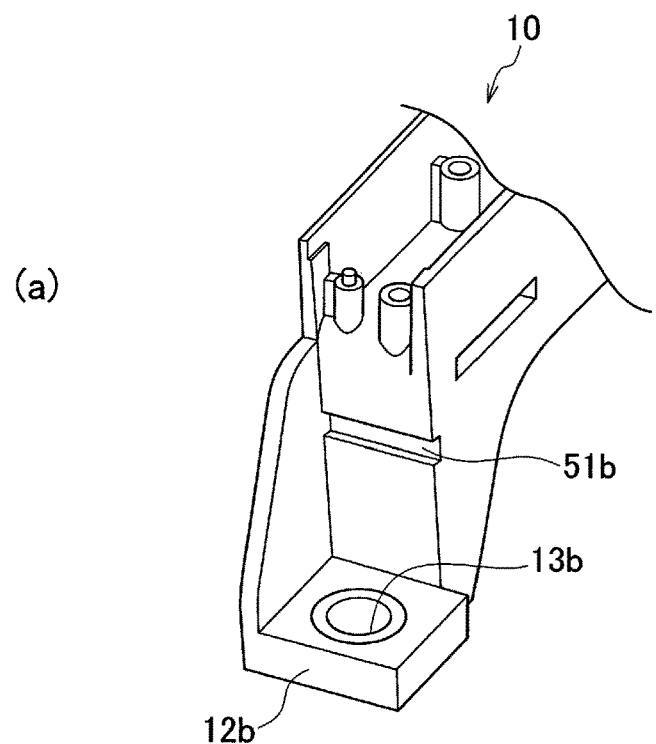
FIG. 5 (a) is a perspective view of a position aligning portion of the sensing module, and (b) is a perspective view of a position aligning portion of the bus bar module.
Figure 5:
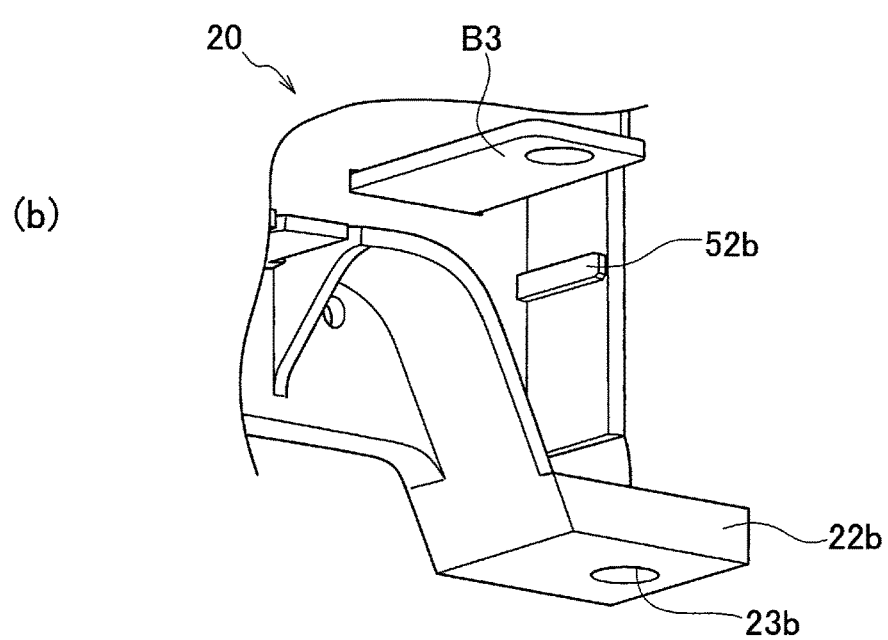

As shown in FIG. 2 and FIG. 4, the bus bar module 20 is configured to include a casing 20A formed of resin or the like, and the bus bars B (B1 to B3) accommodated in the casing 20A. Attachment holes 40a to 40c to which the bus bars B1 to B3 are attached, respectively, are formed on the casing 20A. Terminals 30a to 30c connected with the bus bars B1 to B3, respectively, are supported by terminal supporting portions 21a to 21c, respectively, and extended downward from the casing 20A. Legs 22a and 22b are formed at both ends of the casing 20A, respectively. At the leg 22a, provided is the bus-bar-side communication screw hole 23a for fastening, in a state where the bus bar module 20 is temporarily fixed by after-described temporarily-fixing portions, the sensing module 10 and the bus bar module 20 together by the screw. Similarly, at the leg 22b, provided is the bus-bar-side communication screw hole 23b for fastening, in the state where the bus bar module 20 is temporarily fixed, the sensing module 10 and the bus bar module 20 together by the screw.

On outer edges of the casing 20A, provided are the engaging portions (temporarily-fixing portions) 25a, 25b, 27a and 27b that can engage with the above-mentioned engaged portions (temporarily-fixing portions) 15a, 15b, 17a and 17b of the sensing module 10. When assembling the sensing module and the bus bar module 20, the engaging portions (temporarily-fixing portions) 25a, 25b, 27a and 27b engage with the engaged portions (temporarily-fixing portions) 15a, 15b, 17a and 17b, and thereby the sensing module 10 and the bus bar module 20 are temporarily fixed with each other. After the sensing module 10 and the bus bar module 20 are temporarily fixed with each other, the sensing module 10 and the bus bar module 20 can be made fully-fixed with each other easily by utilizing the sensor-side communication screw holes 13a and 13b of the sensing module 10 and the bus-bar-side communication screw holes 23a and 23b of the bus bar module 20. Namely, the engaged portions 15a, 15b, 17a and 17b and the engaging portions 25a, 25b, 27a and 27b are provided as the temporarily-fixing portions that temporarily fix the sensing module 10 and the bus bar module 20 with each other. In addition, the sensor-side communication screw holes 13a and 13b and the bus-bar-side communication screw holes 23a and 23b are provided as fully-fixing portions that fully fix (integrally fix) the sensing module 10 and the bus bar module 20 with each other.

As shown in FIG. 4 and FIG. 5(b), on an inner side surface of the leg 22b (22a) of the bus bar module 20, formed is the protrusion 52b (52a) that engages with the above-mentioned groove 51b (51a) of the sensing module 10 to align the sensing module 10 and the bus bar module 20 with each other. Therefore, the sensing module 10 and the bus bar module 20 can be easily aligned with each other when assembling the sensing module 10 and the bus bar module 20, and thereby their assembling workability can be improved.

Specifically, the groove 51b (51a) and the protrusion 52b (52a) are aligned with each other, and then the protrusion 52b (52a) is slid along the groove 51b (51a) (i.e. the bus bar module 20 is manually pushed toward the sensing module 10). Then, when pushing of the bus bar module 20 into the sensing module 10 is completed, the engagements of the engaged portions 15a, 15b, 17a and 17b and the engaging portions 25a, 25b, 27a and 27b are also completed (temporarily-fixed state). As the result, the sensing module 10 and the bus bar module 20 are temporarily-fixed with each other, and thereby the sensing module 10 and the bus bar module 20 can be fully-fixed with each other easily by utilizing the communication screw holes 13a, 13b, 23a and 23b with the screws. Note that it is preferable that the temporarily-fixing portions (the engaged portions 15a, 15b, 17a and 17b and the engaging portions 25a, 25b, 27a and 27b) are disposed in the vicinities of the sensing elements SN1 to SN3 (the bus bars B1 to B3).

According to the bus bar assemble type electric current sensor 1 in the present embodiment, the sensing module 10 and the bus bar module 20 can be handled independently from each other until the sensing module 10 and the bus bar module 20 are temporarily-fixed with each other by the temporarily-fixing portions (the engaged portions 15a, 15b, 17a and 17b and the engaging portions 25a, 25b, 27a and 27b). Therefore, characteristics of the sensing elements SN1 to SN3 can be easily checked by inserting test bus bars (not shown in the drawings) of a checker into the insertion holes 11a to 11c of the sensing module 10 that is not yet temporarily-fixed with the bus bar module 20.

In addition, since the sensing module 10 and the bus bar module 20 includes the temporarily-fixing portions (the engaged portions 15a, 15b, 17a and 17b and the engaging portions 25a, 25b, 27a and 27b), the sensing module 10 and the bus bar module 20 can be fully-fixed with each other easily by utilizing the communication screw holes 13a, 13b, 23a and 23b with the screws. Especially, since the sensing module 10 and the bus bar module 20 are integrated with each other after fastening the sensing module 10 and the bus bar module 20 together to fully-fix them with each other, workability at installation in various devices and durability such as vibration resistance can be improved. Note that the bus bar assemble type electric current sensor 1 itself may be fixed with an external device by the screws that fasten the sensing module 10 and the bus bar module 20 together.

Note that it is preferable that the communication screw holes (fully-fixing portions) 13a, 13b, 23a and 23b are disposed near the terminals 30a and 30c of the bus bar B1 and B3 on both ends. In this case, a connection position of the bus bars B1 and B3 with the external device can be made closer to the communication screw holes 13a, 13b, 23a and 23b, and thereby the bus bar assemble type electric current sensor 1 hardly gets broken even if stresses are applied to the bus bars B.

Although the present invention is described by referring the embodiment of the present invention, the present invention is not limited to the above-described embodiment. Scope of the present invention is determined in the context of the claims.

Although the temporarily-fixing portions are provided on both of the sensing module 10 and the bus bar module 20 in the above embodiment, the temporarily-fixing portion(s) that temporarily fixes the sensing module 10 and the bus bar module 20 separably from each other may be provided on at least one of the sensing module 10 and the bus bar module 20.

The invention claimed is:

1. A bus bar assemble type electric current sensor comprising:
   a bus bar module that has a casing, and a plurality of bus bars supported by a plurality of terminal supporting portions of the casing, respectively;
   a sensing module that has a resin molding, and a plurality of sensing elements provided in the resin molding and associated with the plurality of bus bars, respectively, wherein
   a plurality of insertion holes into which the plurality bus bars are inserted, respectively, is provided, on the sensing module, in vicinities of the plurality sensing elements, respectively,
   a temporarily-fixing portion that temporarily fixes the sensing module and the bus bar module separably from each other is provided on at least one of the sensing module and the bus bar module,
   a fully-fixing portion that integrally fixes the sensing module and the bus bar module with each other is provided on each of the sensing module and the bus bar module, and
   the sensing module and the bus bar module are independent from each other until being temporarily fixed with each other, and a plurality of test bus bars for checking the plurality of sensing elements is capable of being inserted into the plurality of insertion holes, respectively.

2. The bus bar assemble type electric current sensor according to claim 1, wherein
   the fully-fixing portion includes a sensor-side communication screw hole to be fixed with an external device and formed on the resin molding, and a bus-bar-side communication screw hole to be fixed with the external device and formed on the casing, and
   the sensor-side communication screw hole and the bus-bar-side communication screw hole communicate with each other in a state where the sensing module and the bus bar module are temporarily fixed with each other by the temporarily-fixing portion.

3. The bus bar assemble type electric current sensor according to claim 1, wherein
   the temporarily-fixing portion includes an engaged portion that is formed on one of the sensing module and the bus bar module, and an engaging portion that is formed on another of the sensing module and the bus bar module and engages with the engaged portion.

4. The bus bar assemble type electric current sensor according to claim 1, wherein the temporarily-fixing element is disposed in any vicinity of the plurality of sensing elements.

5. The bus bar assemble type electric current sensor according to claim 1, wherein
   the resin molding has a beam extending in a given direction, and has legs at both ends of the beam, respectively,
   the plurality of sensing elements is arranged on the beam in the given direction,
   the temporarily-fixing portion is formed on the beam, and the fully-fixing portion is formed on the legs.

* * * * *